(12) United States Patent
Chen et al.

(10) Patent No.: US 7,229,920 B2
(45) Date of Patent: Jun. 12, 2007

(54) METHOD OF FABRICATING METAL SILICIDE LAYER

(75) Inventors: Yi-Wei Chen, Dajia Township, Taichung County (TW); Tzung-Yu Hung, Sinshih Township, Tainan County (TW); Yi-Yiing Chiang, Taipei (TW); Chao-Ching Hsieh, Hsinchu Hsien (TW); Yu-Lan Chang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 34 days.

(21) Appl. No.: 11/034,400

(22) Filed: Jan. 11, 2005

(65) Prior Publication Data

US 2006/0154474 A1 Jul. 13, 2006

(51) Int. Cl.
*H01L 21/44* (2006.01)

(52) U.S. Cl. ............ 438/663; 438/651; 438/682; 257/E21.006; 257/E21.497; 257/E21.593

(58) Field of Classification Search ............... 438/663, 438/664, 650, 651, 648, 649, 655, 656, 682, 438/683, 685
See application file for complete search history.

(56) References Cited

U.S. PATENT DOCUMENTS

| | | | | |
|---|---|---|---|---|
| 4,910,578 A | * | 3/1990 | Okamoto | 357/71 |
| 5,646,070 A | * | 7/1997 | Chung | 438/663 |
| 5,911,114 A | * | 6/1999 | Naem | 438/684 |
| 5,981,372 A | * | 11/1999 | Goto et al. | 438/621 |
| 6,294,464 B1 | * | 9/2001 | Trivedi | 438/649 |
| 6,605,533 B2 | * | 8/2003 | Trivedi | 438/649 |
| 2005/0079695 A1 | * | 4/2005 | Carriere et al. | 438/592 |

* cited by examiner

*Primary Examiner*—David Nhu
(74) *Attorney, Agent, or Firm*—J.C. Patents

(57) ABSTRACT

A method of fabricating a metal silicide layer over a substrate is provided. First, a hard mask layer is formed over a gate formed on a substrate and a portion of the substrate is exposed. Thereafter, a first metal silicide layer, which is a cobalt silicide or a titanium silicide layer, is formed on the exposed substrate. After that, the hard mask layer is removed and a second metal silicide layer is formed over the gate, wherein a material of the second metal silicide layer is selected from a group consisting of nickel silicide, platinum silicide, palladium silicide and nickel alloy. Since different metal silicide layers are formed on the substrate and the gate, the problem of having a high resistance in lines with a narrow line width and the problem of nickel silicide forming spikes and pipelines in the source region and the drain region are improved.

18 Claims, 4 Drawing Sheets

METHOD OF FABRICATING METAL SILICIDE LAYER

BACKGROUND OF THE INVENTION

1. Field of the Invention

The present invention relates to a semiconductor processing method and structure thereof. More particularly, the present invention relates to a method of fabricating a metal silicide layer such that different metal silicide materials are formed on different crystalline regions of a substrate.

2. Description of the Related Art

In ultra-high level integration, the size of each semiconductor device is reduced so that the level of integration can continue to increase. After miniaturizing the electronic devices, the semiconductor integrated circuit can have the highest level of integration. However, as the dimension of an electronic device is reduced, a number of challenging problems is encountered in the process of fabricating the integrated circuits. In particular, as devices continue to shrink in size, a reduction in the resistance of electrical connection structures has become increasingly important because any increase in the resistance will directly lead to a slow-down in the operating speed through an increase in RC delay.

To reduce the resistance of connection structures, a self-aligned silicide process is frequently carried out to form a metal silicide layer thereon. Due to the high melting point, stability and low resistance of a metal silicide layer, the use of metal silicide layers in the fabrication of integrated circuits has become increasingly common. In the deep sub-micron regime of integrated circuit fabrication, a polycide gate structure instead of a conventional polysilicon gate structure is often used to improve device operating characteristics, lower resistance and minimize RC delay because line width, contact area and junction depth are all reduced. Furthermore, forming a metal silicide layer over a junction is an effective means of lowering contact resistance at the junction.

In general, a metal silicide film is formed by performing a thermal treatment to a metallic film. The metallic film can be deposited by performing an evaporation process or a sputtering process. Thereafter, the metallic film is annealed by heating inside a furnace or performing a rapid thermal treatment in an atmosphere containing pure inert gases (nitrogen or argon) so that the metal reacts with silicon at their interface to form a metal silicide layer. The most commonly used metal silicide materials include titanium silicide, tungsten silicide, cobalt silicide, nickel silicide, molybdenum silicide and platinum silicide.

Because titanium silicide has a low resistance and is amenable to fine processing control, it is one of the most commonly deployed metal silicide materials. Yet, as the line width of the integrated circuits continues to shrink, the line width of gate lines is reduced correspondingly. With a narrowing of the gate line, the so-called narrow line width effect is increasingly dominant in a titanium silicide layer. When the gate width is lowered to 1 μm or smaller, the sheet resistance of a titanium silicide layer formed on the gate will increase with a decrease in dimension. In other words, the advantage of forming a titanium silicide layer over the gate to lower the sheet resistance is gone. Under these circumstances, titanium silicide layers are replaced using cobalt silicide layers. However, the same problem is encountered when the line width is again reduced. Among the types of metal silicide materials, nickel silicide appears to be the most promising one for replacing cobalt silicide because nickel silicide does not have the aforementioned problem.

Nevertheless, spiking often occurs in the heavily doped P-type region while piping often occurs in the heavily doped N-type region after a nickel silicide layer is formed on an active area.

SUMMARY OF THE INVENTION

Accordingly, at least one objective of the present invention is to provide a method of fabricating a metal silicide layer capable of minimizing the increase in resistance accompanied by a reduction of line width.

At least a second objective of the present invention is to provide a method of fabricating a metal silicide layer capable of removing the spiking problem in heavily doped P-type area and piping problem in heavily doped N-type area when using nickel silicide.

To achieve these and other advantages and in accordance with the purpose of the invention, as embodied and broadly described herein, the invention provides a method of fabricating a metal silicide layer. First, a substrate having at least a gate is provided. Thereafter, a hard mask layer is formed over the gate to expose a portion of the substrate. A first metal silicide layer is formed on the exposed substrate. The first metal silicide layer is a cobalt silicide layer or a titanium silicide layer. The hard mask layer is removed and then a second metal silicide layer is formed over the gate. The second metal silicide is fabricated using a material selected from a group consisting of nickel silicide, platinum silicide, palladium silicide and nickel alloy silicide.

According to one preferred embodiment of the present invention, the steps for forming the second metal silicide layer include depositing a second metallic material over the substrate to form a second metallic layer. The second metallic material is selected from a group consisting of nickel, platinum and palladium. Thereafter, a low-temperature rapid thermal process is carried out at a temperature below 500° C. Finally, the unreacted second metallic material is removed. Furthermore, the steps for forming the first metal silicide layer include depositing a first metallic material over the substrate to form a first metallic layer. The first metallic material is selected from a group consisting of cobalt and titanium. Thereafter, a first rapid thermal process is carried out and then the unreacted first metallic material is removed. Finally, a second rapid thermal process is carried out. The first and the second rapid thermal process are performed at a temperature between 700° C. to 900° C. In addition, the hard mask layer comprises a silicon oxynitride layer, for example.

The present invention also provides another method of fabricating a metal silicide layer on a substrate having a polysilicon portion and a doped monocrystalline silicon portion. First, a hard mask layer is formed on the polysilicon portion of the substrate to expose the doped monocrystalline silicon portion of the substrate. Thereafter, a first metal silicide layer is formed over the exposed doped monocrystalline silicon portion. The first metal silicide layer is a cobalt silicide layer or a titanium silicide layer. After that, the hard mask layer is removed and then a second metal silicide layer is formed over the polysilicon portion. The second metal silicide layer is fabricated using a material selected from a group consisting of nickel silicide, platinum silicide, palladium silicide and nickel alloy silicide.

According to another preferred embodiment of the present invention, the steps for forming the second metal silicide layer include depositing a second metallic material over the substrate to form a second metallic layer. The second metallic material is selected from a group consisting of nickel, platinum and palladium. Thereafter, a low-temperature rapid thermal process is carried out at a temperature below 500° C. Finally, the unreacted second metallic material is removed. Furthermore, the steps for forming the first metal silicide layer include depositing a first metallic material over the substrate to form a first metallic layer. The first metallic material is selected from a group consisting of cobalt and titanium. Thereafter, a first rapid thermal process is carried out and then the unreacted first metallic material is removed. Finally, a second rapid thermal process is carried out. The first and the second rapid thermal process are performed at a temperature between 700° C. to 900° C. In addition, the hard mask layer comprises a silicon oxynitride layer, for example.

In the present invention, different types of metal silicide layers are formed on the substrate and the gate surface. This not only counteracts the increase in resistance due to a narrowing of the gate line width and the accompanied reduction in contact area between the metal silicide layer and the metallic interconnect above the gate, but also resolves spiking problem in the heavily doped P-type region and piping problem in the heavily doped N-type region when nickel silicide alone is used.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
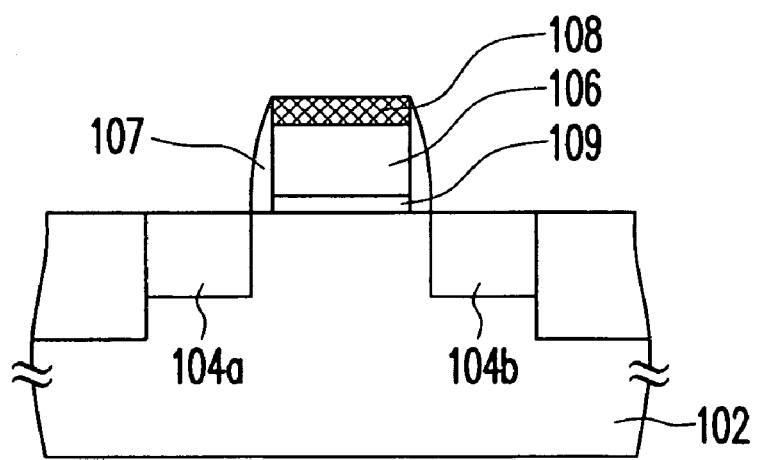
FIGS. 1A through 1E are schematic cross-sectional views showing the steps for fabricating a metal silicide layer over a substrate according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The concept behind the method of fabricating a metal silicide layer is to form one type of metal silicide layer over the source region and drain region of the substrate and another type of metal silicide layer over the gate. Hence, the high resistance problem in narrow gate lines and the spiking and piping problem in the source/drain regions for using nickel silicide are resolved at the same time. The following embodiment describes a few applications of the present invention and hence should be used to limit the scope of the present invention. In fact, the present invention can be applied to any semiconductor fabrication process that demands the deposition of a different type of metal silicide material on a different crystalline structure.

FIGS. 1A through 1E are schematic cross-sectional views showing the steps for fabricating a metal silicide layer over a substrate according to one preferred embodiment of the present invention. As shown in FIG. 1A, a substrate 102 is provided. Then, conventional processing steps are used to form a gate oxide layer 109 and a gate 106 over the substrate. A source region 104a and a drain region 104b are formed in the substrate 102 on each side of the gate 106. A hard mask layer 108 is formed over the gate 106 to expose the substrate 102. The hard mask layer 108 is a silicon oxynitride layer, for example. In general, a cap layer is also formed over the gate 106 in the fabrication process to protect the gate against any damage during the etching process. Hence, the cap layer may also serve as the aforementioned hard mask layer 108. In addition, spacers 107 are formed on the sidewalls of the gate 106.

Figure 1B:
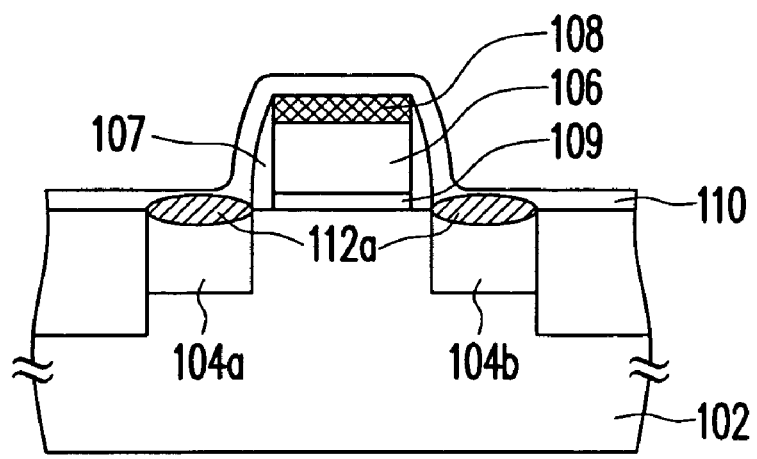
Figure 1C:
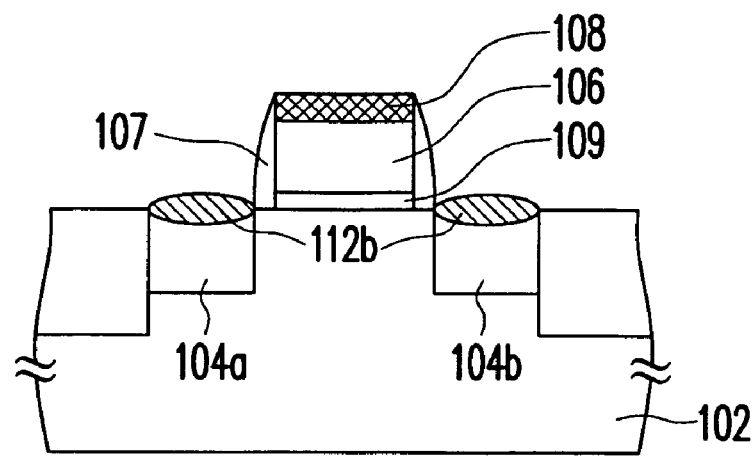

Thereafter, a first metal silicide layer is formed over the exposed substrate 102 as shown in FIGS. 1B and 1C. First, as shown in FIG. 1B, a first metallic material is deposited over the substrate 102 to form a first metallic layer 110. The first metallic layer is a layer of cobalt or titanium, for example. A first rapid thermal process (RTP) is carried out at a temperature between about 700° C. to 900° C. such that the first metallic layer 110 reacts with the substrate 102 to form a first metal silicide layer 112a. After that, as shown in FIG. 1C, the unreacted first metallic layer 110 on the substrate 102 is removed. Since the metal silicide layer mainly serves to lower the resistance in the source region 104a and the drain region 104b but the first metal silicide layer 112a formed after the first RTP is rather unstable, a second RTP process is performed at a temperature between about 700° C. to 900° C. In the second RTP process, the first metal silicide layer 112a is converted to another first metal silicide layer 112b having a stable and low-resistance crystalline phase. The first metal silicide layer 112b is cobalt silicide layer or a titanium silicide layer, for example.

Figure 1D:
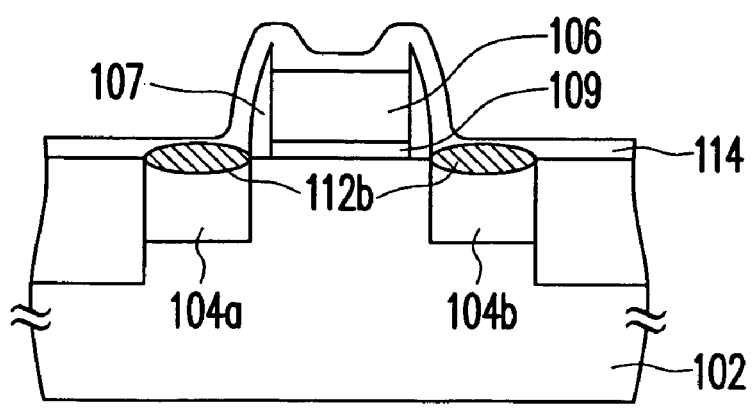

As shown in FIG. 1D, the hard mask layer 108 is removed. Thereafter, a second metallic layer 114 is formed over the gate 106. The second metallic layer is fabricated using a material selected from a group consisting of nickel, platinum and palladium.

Figure 1E:
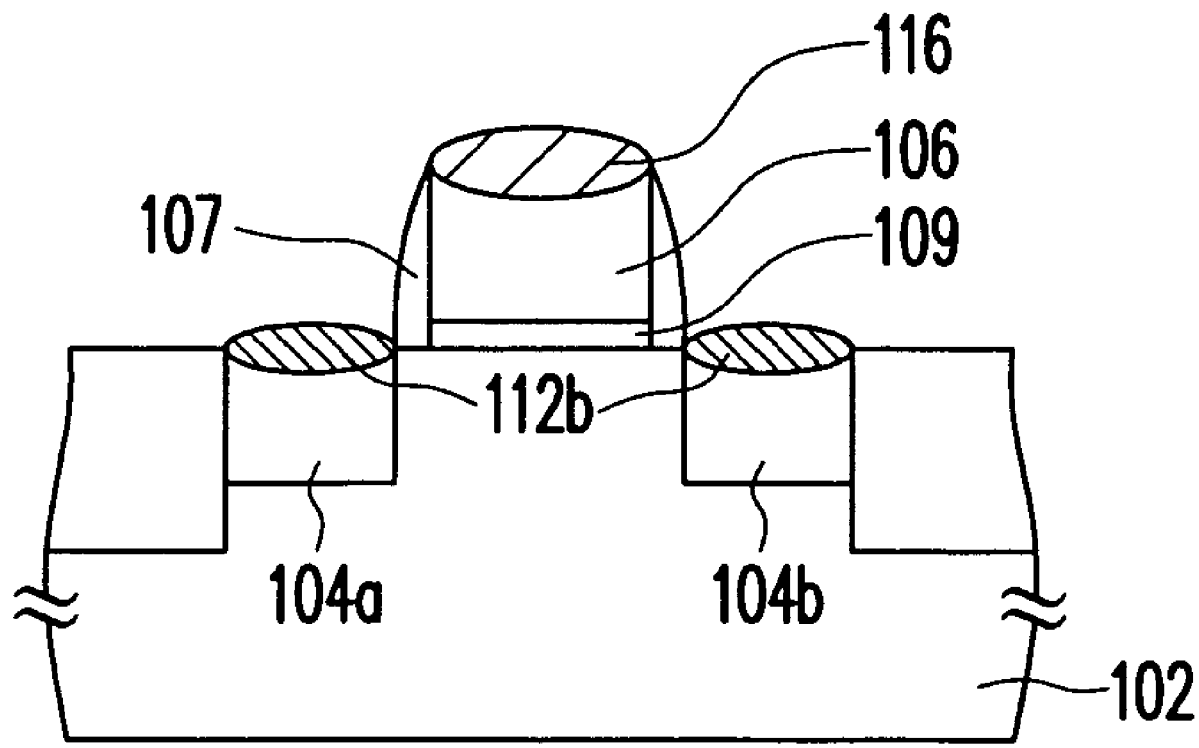

As shown in FIG. 1E, a low-temperature rapid thermal process (LTRTP) is carried out so that the second metallic layer 114 reacts with the gate 106 material to form a second metal silicide layer 116. The LTRTP is performed at a temperature slightly lower than 500° C. The so-called "low-temperature" in the RTP refers to a temperature below that needed to carry out the first and the second RTP. The second metal silicide layer 116 is fabricated using a material selected from a group consisting of nickel silicide, platinum silicide, palladium silicide and nickel alloy silicide, for example. Finally, the unreacted second metallic layer 114 is removed. At the end of the aforementioned operations, a stable and low resistance first metal silicide layer 112b and second metal silicide layer 116 capable of reducing the resistance at connective juncture and improving operating efficiency are formed.

Figure 2:
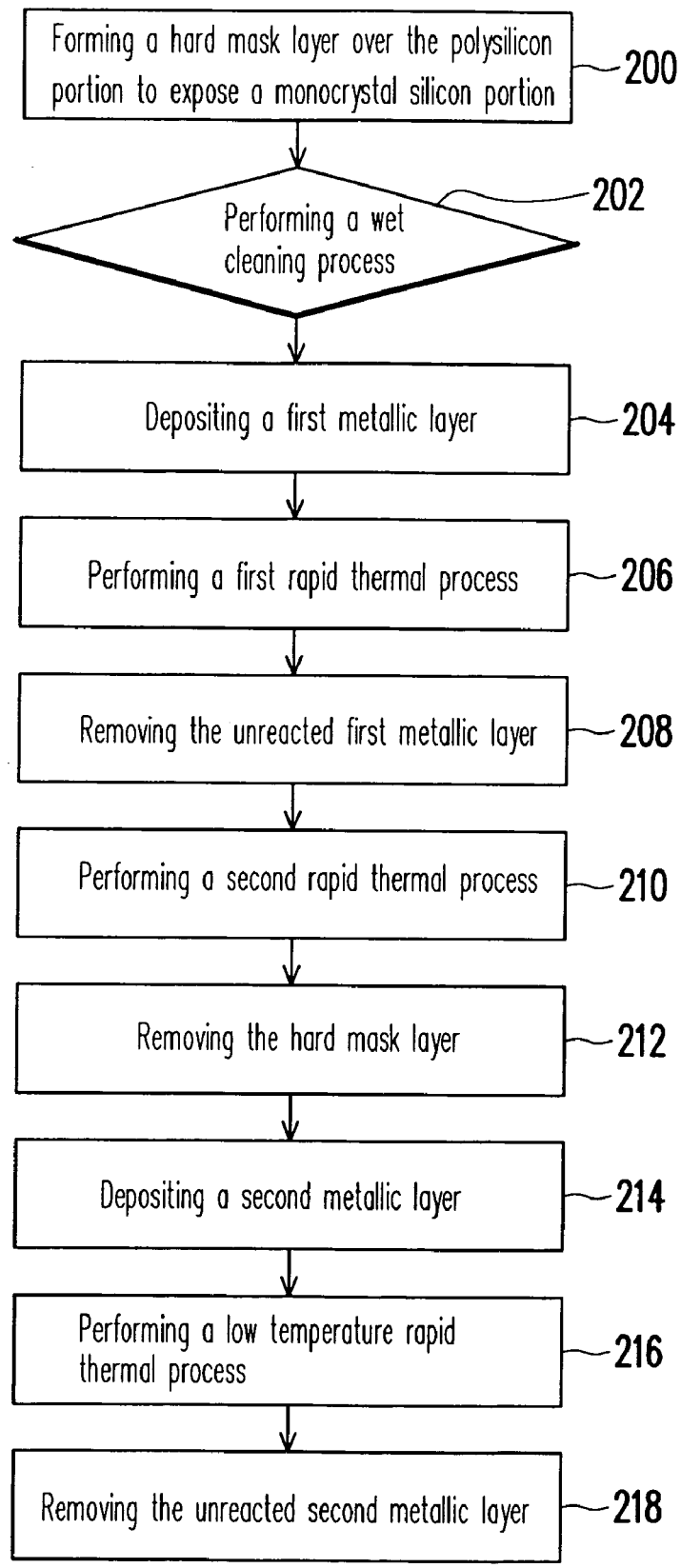
FIG. 2 is a flowchart showing the steps carried out to fabricate a metal silicide layer over a substrate according to another preferred embodiment of the present invention.

FIG. 2 is a flowchart showing the steps carried out to fabricate a metal silicide layer over a substrate according to another preferred embodiment of the present invention. As shown in FIG. 2, the method of the present invention is suitable for forming a metal silicide layer over a substrate having a polysilicon portion and a doped monocrystalline silicon portion. First, in step 200, a hard mask layer is formed over the polysilicon portion to expose the doped monocrystalline silicon portion of the substrate. The hard mask layer is a silicon oxynitride layer, for example.

To prevent any dust particles precipitated on the surface of the substrate from affecting the quality of the subsequently formed metallic layer, a wet cleaning operation is optionally performed in step 202.

Thereafter, steps 204 to 210 are performed to form a first metal silicide layer over the exposed doped monocrystalline silicon portion. First, metallic material is deposited over the substrate to form a first metallic layer (in step 204). The metallic layer is a layer of cobalt or titanium, for example. A first rapid thermal process (in step 206) is carried out at a temperature between about 700° C. to 900° C. so that the first metallic layer reacts with the silicon substrate to form a first metal silicide layer. However, the first metal silicide layer is chemically not very stable. Therefore, after removing the unreacted first metallic layer (in step 208), a second rapid thermal process (in step 210) is carried out at a temperature between about 700° C. to 900° C. to stabilize the first metal silicide layer. The first metal silicide layer is a cobalt silicide layer or a titanium silicide layer.

In step 212, the hard mask layer is removed. In steps 214 to 218, a second metallic layer is formed over the polysilicon portion of the substrate. First, a second metallic material is deposited over the substrate to form a second metallic layer (in step 214). The second metallic layer is fabricated using a material selected from a group consisting of nickel, platinum and palladium, for example. Thereafter, a low-temperature rapid thermal process (in step 216) is carried out at a temperature slightly below 500° C. The so-called "low-temperature" in the low-temperature rapid thermal process refers to a temperature below the first and the second rapid thermal process for forming the first metal silicide layer. After the low-temperature rapid thermal process, a second metal silicide layer is formed over the polysilicon portion of the substrate. The second metal silicide layer is fabricated using a material selected from a group consisting of nickel silicide, platinum silicide, palladium silicide and nickel alloy silicide, for example. Finally, a wet etching operation is performed to remove the unreacted second metallic layer (in step 218).

In summary, metal silicide materials play a very important role in deep sub-micron fabrication technologies. It mainly serves to lower the sheet resistance of gate and contact resistance at the junctions. One major aspect of the present invention is to form a different type of metal silicide material on the gate and the substrate surface. This not only improves the increase in resistance accompanied by a reduction of line width, but also resolves the spiking problem and the piping problem in the source region and the drain region when using nickel is deployed. Hence, the electrical properties of deep sub-micron integrated circuit devices are improved and optimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal silicide layer, comprising the steps of:
    providing a substrate having at least a gate thereon, the gate having a dielectric and a polysilicon;
    forming a hard mask layer over the gate but exposes the substrate;
    forming a first metal silicide layer on the exposed substrate, wherein the first metal silicide layer is a cobalt silicide layer or a titanium silicide layer;
    removing the hard mask layer to expose the gate; and
    forming a second metal silicide layer on the exposed gate to form a multi-layer gate structure having at least the dielectric, the polysilicon and the second metal silicide layer, wherein the second metal silicide layer is selected from a group consisting of nickel silicide, platinum silicide, palladium silicide and nickel alloy silicide.

2. The method of claim 1, wherein the step of forming the second metal silicide layer comprises:
    depositing a second metallic material over the substrate to form a second metallic layer, wherein the second metallic material is selected from a group consisting of nickel, platinum and palladium;
    performing a low-temperature rapid thermal process; and
    removing an unreacted second metallic layer.

3. The method of claim 2, wherein the low-temperature rapid deposition process is performed at a temperature below 500° C.

4. The method of claim 1, wherein the step of forming the first metal silicide layer comprises:
    depositing a first metallic material over the substrate to form a first metallic layer, wherein the first metallic material is cobalt or titanium;
    performing a first rapid thermal process;
    removing an unreacted first metallic layer; and
    performing a second rapid thermal process.

5. The method of claim 4, wherein the first and the second rapid thermal processes are performed at a temperature between 700° C. to 900° C.

6. The method of claim 1, wherein the hard mask layer comprises a silicon oxynitride layer.

7. A method of fabricating a metal silicide layer over a substrate having a polysilicon portion and a doped monocrystalline silicon portion, comprising the steps of:
    forming a hard mask layer over the polysilicon portion of the substrate to expose the doped monocrystalline silicon portion;
    forming a first metal silicide layer over the exposed doped monocrystalline silicon portion, wherein the first metal silicide layer is a cobalt silicide layer or a titanium silicide layer;
    removing the hard mask layer; and
    forming a second metal silicide layer over the polysilicon portion, wherein the second metal silicide layer is fabricated using a material selected from a group consisting of nickel silicide, platinum silicide, palladium silicide and nickel alloy silicide.

8. The method of claim 7, wherein the step of forming the second metal silicide layer comprises:
    depositing a second metallic material over the substrate to form a second metallic layer, wherein the second metallic material is selected from a group consisting of nickel, platinum and palladium;
    performing a low-temperature rapid thermal process; and
    removing an unreacted second metallic layer.

9. The method of claim 8, wherein the low-temperature rapid deposition process is performed at a temperature below 500° C.

10. The method of claim 7, wherein the step of forming the first metal silicide layer comprises:
    depositing a first metallic material over the substrate to form a first metallic layer, wherein the first metallic material is cobalt or titanium;
    performing a first rapid thermal process;
    removing an unreacted first metallic layer; and
    performing a second rapid thermal process.

11. The method of claim 10, wherein the first and the second rapid thermal processes are performed at a temperature between 700° C. to 900° C.

12. The method of claim 7, wherein the hard mask layer comprises a silicon oxynitride layer.

13. A method of fabricating a metal silicide layer, comprising the steps of:
  providing a substrate having at least a gate thereon, the gate having a dielectric and a polysilicon, wherein the gate is patterned by a hard mask layer and the hard mask layer is on the gate to expose the substrate;
  forming a first metal silicide layer on the exposed substrate, wherein the first metal silicide layer is a cobalt silicide layer or a titanium silicide layer;
  removing the hard mask layer to expose the gate; and
  forming a second metal silicide layer on the exposed gate to form a multi-layer gate structure having at least the dielectric, the polysilicon and the second metal silicide layer, wherein the second metal silicide layer is selected from a group consisting of nickel silicide, platinum silicide, palladium silicide and nickel alloy silicide.

14. The method of claim 13, wherein the step of forming the second metal silicide layer comprises:
  depositing a second metallic material over the substrate to form a second metallic layer, wherein the second metallic material is selected from a group consisting of nickel, platinum and palladium;
  performing a low-temperature rapid thermal process; and
  removing an unreacted second metallic layer.

15. The method of claim 14, wherein the low-temperature rapid deposition process is performed at a temperature below 500°C.

16. The method of claim 13, wherein the step of forming the first metal silicide layer comprises:
  depositing a first metallic material over the substrate to form a first metallic layer, wherein the first metallic material is cobalt or titanium;
  performing a first rapid thermal process;
  removing an unreacted first metallic layer; and
  performing a second rapid thermal process.

17. The method of claim 16, wherein the first and the second rapid thermal processes are performed at a temperature between 700°C to 900°C.

18. The method of claim 13, wherein the hard mask layer comprises a silicon oxynitride layer.

* * * * *